July 8, 1958 — F. WOHLMAN, JR — 2,842,166

FORMING APPARATUS FOR SEMICONDUCTOR TRANSLATING DEVICE COMPONENTS

Filed Aug. 31, 1955 — 7 Sheets-Sheet 1

INVENTOR.
FRED WOHLMAN, JR.,
BY
Henry Heyman
ATTORNEY.

July 8, 1958 F. WOHLMAN, JR 2,842,166

FORMING APPARATUS FOR SEMICONDUCTOR TRANSLATING DEVICE COMPONENTS

Filed Aug. 31, 1955 7 Sheets-Sheet 2

INVENTOR.
FRED WOHLMAN, JR.,
BY Henry Heyman
ATTORNEY.

INVENTOR.
FRED WOHLMAN, JR.,
BY
Henry Heyman
ATTORNEY.

July 8, 1958

F. WOHLMAN, JR 2,842,166

FORMING APPARATUS FOR SEMICONDUCTOR TRANSLATING DEVICE COMPONENTS

Filed Aug. 31, 1955

7 Sheets-Sheet 4

INVENTOR.
FRED WOHLMAN, JR.,
BY
Henry Heyman
ATTORNEY.

July 8, 1958 F. WOHLMAN, JR 2,842,166

FORMING APPARATUS FOR SEMICONDUCTOR TRANSLATING DEVICE COMPONENTS

Filed Aug. 31, 1955 7 Sheets-Sheet 5

INVENTOR.
FRED WOHLMAN, JR.,
BY Henry Heyman
ATTORNEY.

July 8, 1958 F. WOHLMAN, JR 2,842,166

FORMING APPARATUS FOR SEMICONDUCTOR TRANSLATING DEVICE COMPONENTS

Filed Aug. 31, 1955 7 Sheets-Sheet 6

INVENTOR.
FRED WOHLMAN, JR.,
BY
Henry Heyman
ATTORNEY.

July 8, 1958 F. WOHLMAN, JR 2,842,166

FORMING APPARATUS FOR SEMICONDUCTOR TRANSLATING DEVICE COMPONENTS

Filed Aug. 31, 1955 7 Sheets-Sheet 7

INVENTOR.
FRED WOHLMAN, JR.,
BY
Henry Heyman
ATTORNEY.

United States Patent Office 2,842,166

Patented July 8, 1958

2,842,166

FORMING APPARATUS FOR SEMICONDUCTOR TRANSLATING DEVICE COMPONENTS

Fred Wohlman, Jr., Inglewood, Calif., assignor to Hughes Aircraft Company, Culver City, Calif., a corporation of Delaware Application August 31, 1955, Serial No. 531,766

7 Claims. (Cl. 140—71)

The present invention relates generally to mechanisms for forming components of semiconductor translating devices and relates more specifically to apparatus for bending or kinking a contact element or whisker of a semiconductor translating device into a predetermined configuration commensurate with the use to which it is to be placed.

In the manufacture of semiconductor translating devices such as, for example, transistors, diodes, rectifiers, photocell devices and the like, an inherent property of such devices resides in the very small and delicate nature of the components thereof. The minute nature of these components, coupled with the necessity for extreme accuracy in the forming and manufacturing thereof, creates serious problems relative to the physical handling, shaping and aligning of one component relative to another. In most of these semiconductor translating devices, leads are employed to which are affixed a wire or ribbon conductor member that may be in the nature of .003 in thickness or diameter. These leads are frequently referred to as whiskers and cooperate with crystals employed in the semiconductor translating devices. The whiskers are generally 1/16" to 3/32" long and bent with one or more convolutions in order to provide for axial resiliency.

Heretofore, various mechanisms have been employed to bend, form, or kink the whiskers; however, these mechanisms have been unsatisfactory due to high rejection rates caused by improperly formed whiskers, breaking or adversely bending the whiskers or breaking of the bonding material for the whiskers. In order that manufacturing techniques may be commensurate with the necessity for mass production of these relatively small semiconductor translating device components, it has therefore become necessary to provide mechanisms including sufficient automation as to enable use in these situations. Such mechansims, coupled with manually operable apparatus, provide sufficient flexibility in the operation of the device to permit use thereof under various manufacturing conditions.

It is, accordingly, one important object of the present invention to provide a novel apparatus for bending, forming or kinking leads or whiskers forming components of semiconductor translating devices.

It is another important object of the present invention to provide novel means for supporting, guiding, aligning and adjustably positioning dies utilized to form components of semiconductor translating devices.

It is a further important object of the present invention to provide a novel mechanism for supporting, aligning and positioning components of semiconductor translating devices relative to forming dies as to enable multiple operations upon these components and insertion in and removal from positions within forming dies.

It is still another important object of the present invention to provide a novel apparatus including supporting, aligning and holding structure for components of semiconductor translating devices and forming mechanisms for portions thereof, in which novel means are employed for movably guiding, aligning and flexibly mounting operating components of the forming apparatus.

A still further important object of the present invention is to provide a forming apparatus for components of semiconductor translating devices wherein novel means are employed for actuating a pair of dies utilized to form, bend or kink whiskers employed in the semiconductor translating devices.

Other and further important objects of the present invention will become apparent from the disclosures in the following detailed specification, appended claims and accompanying drawings, wherein:

Figure 1:
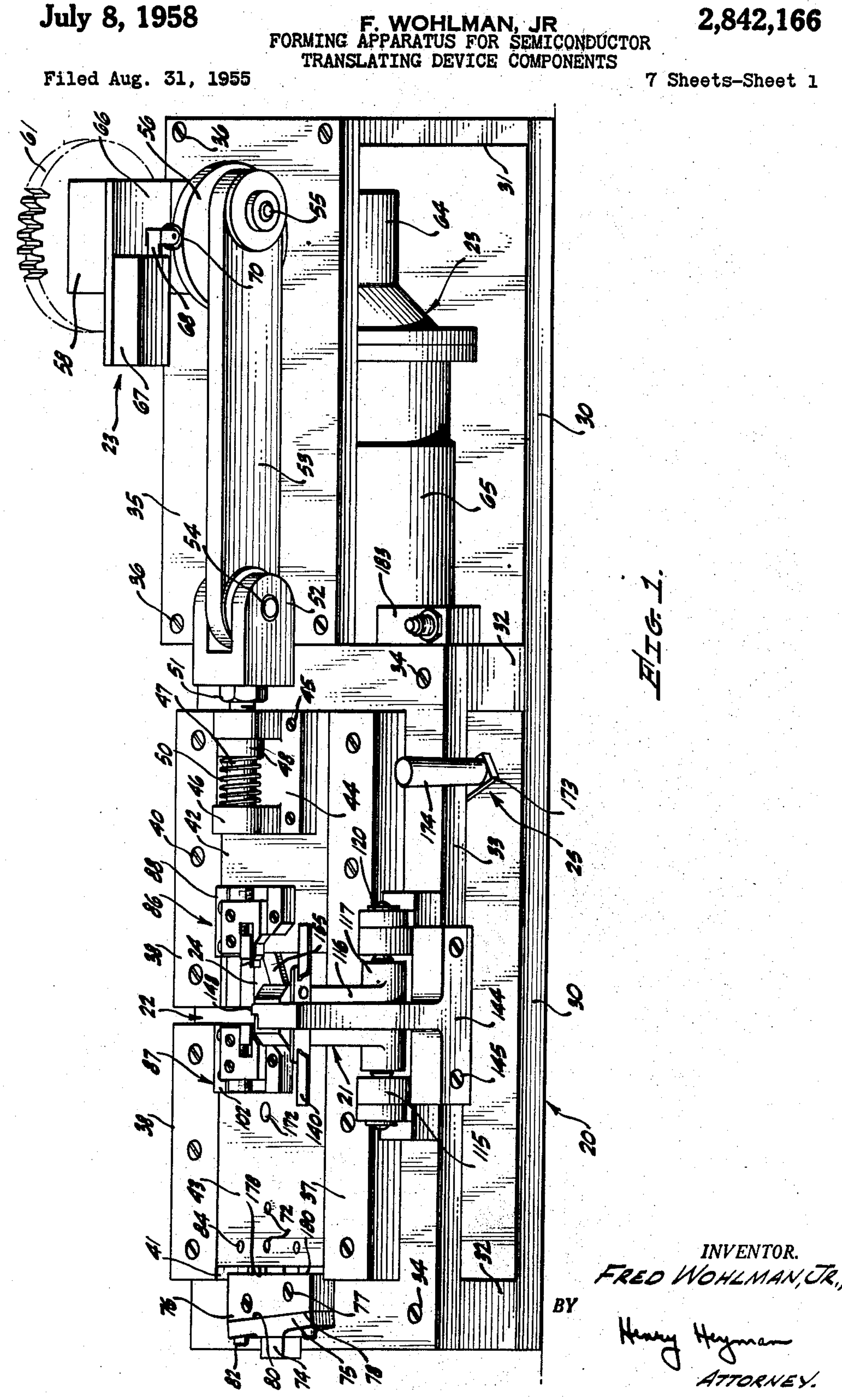
Figure 1 is a top plan view of the forming apparatus of the present invention.

With reference to the drawings, the kinking apparatus of the present invention includes generally a base structure 20; aligning and holding means 21 for components of semiconductor translating devices; a pair of cooperable dies 22; means 23 for effecting movement of at least one of the dies; a preforming mechanism 24; and a means 25 for manually moving at least one of the dies.

With reference primarily to Figs. 1, 3, 10 and 11, the base structure 20 includes a base plate 30 having a plate 31 disposed normal thereto at one end thereof. A pair of bracket members 32 are disposed upwardly from the plate 30 at another end and in approximately the central area thereof. The bracket members 32 are adapted angularly to support a platform member 33 that is retained in position thereon by means of screws 34. Additionally, one of the brackets 32, together with the end plate member 31, serves to support another plate member 35 on which the driving mechanism 23 is mounted. The plate member 35 is retained in position by means of a plurality of screws 36. It is to be noted that the platform 33 is positioned at approximately 45° to a horizontal, in order that various components of the present apparatus may readily be accessible to an operator thereof. The platform 33 has mounted thereon a base or lower way member 37 and a pair of coextensively arranged spaced upper way members 38. The way members 37 and 38 are retained on the platform 33 by means of a plurality of screws 40. The way members 37 and 38 are laterally spaced and positioned in parallel relationship. These members are also provided with longitudinally extending generally V-shaped ways 41 that are adapted for slidable reception of die plates 42 and 43. The upper surfaces of the die plates 42 and 43 are positioned in coplanar alignment with upper surfaces of the way members 37 and 38, as shown primarily in Figs. 2 and 4.

Figures 2, 8:
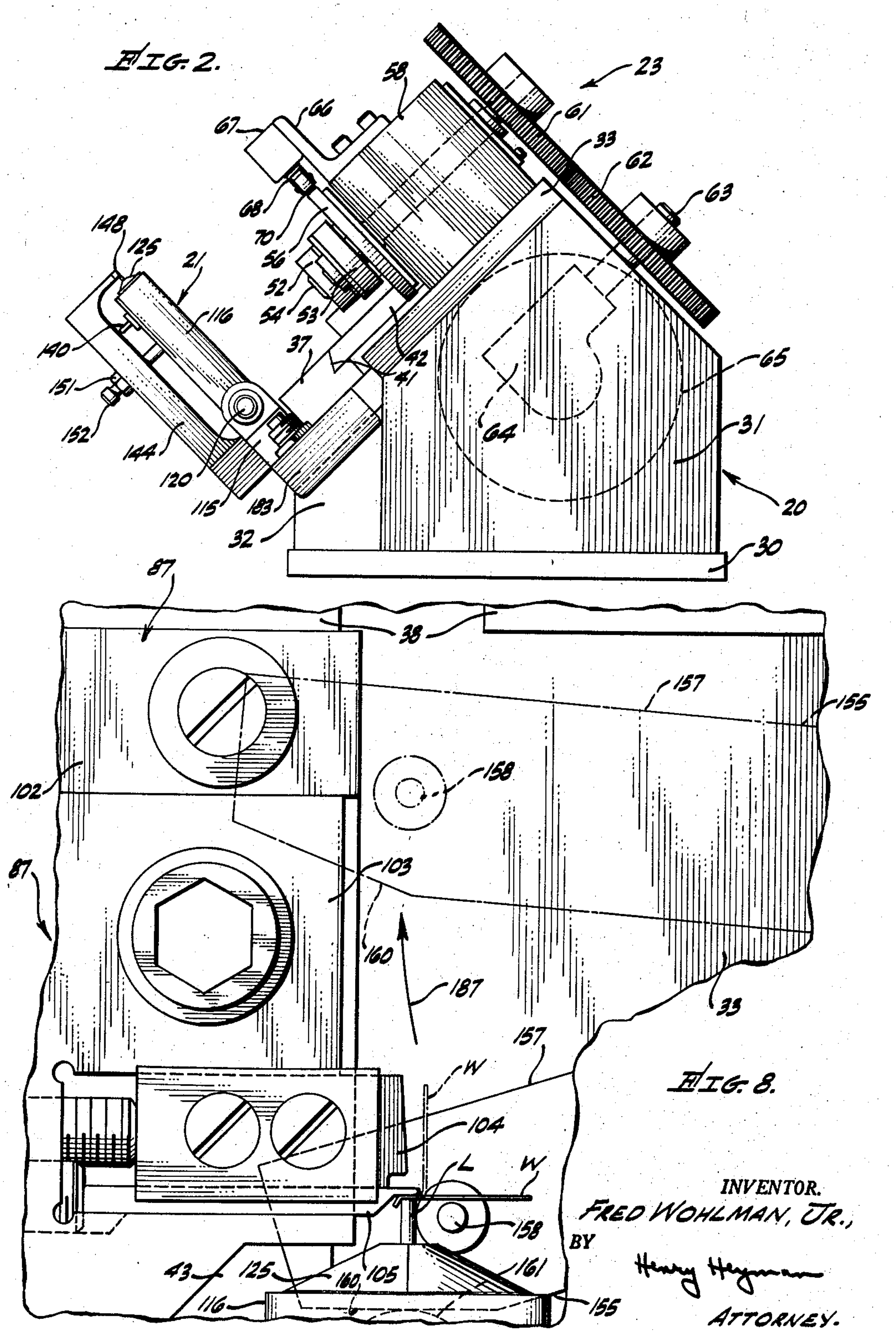
Fig. 2 is a right end view thereof.
Fig. 8 is a greatly enlarged fragmentary view showing a portion of one die, the supporting mechanism for the semiconductor translating device component and the whisker prior to formation thereof.

The die plate 42 has a bracket 44 secured to the upper surface thereof as by means of screws 45, there being a pair of spaced journals 46 depended upwardly from the bracket 44. A shaft 47 is adapted for longitudinal slidable disposition through the journals 46, there being a collar 48 disposed on the shaft, attached thereto and adapted to bear against an inwardly directed face of one of the journals 46. A compression spring 50 is disposed about the shaft 47 between the collar 48 and a face of the other of the journals 46. The shaft 47 is connected by means of an adjustable link 51 to a clevis 52 that is in turn pinned to a driving link 53 by means of a pin and nut arrangement 54. The driving link 53, as shown in Fig. 1, is eccentrically connected, by means of a shaft 55, to a cam 56 that is in turn driven by means of an output shaft 57 extending from a speed reducing gear box 58. The gear box 58 has an input shaft 60 on which is mounted a gear 61 that is in turn adapted for cooperation with a second gear 62 carried by a shaft 63. The shaft 63 extends to a right angle drive 64 that is mounted on one end of a driving motor 65. The driving motor 65 is mounted beneath the plate member 35 on one side of one of the support brackets 32. Thus, when the motor 65 is energized, the gears 62 and 61 will be driven, whereby to drive the output shaft 57 of the gear box 58 and the cam 56 to reciprocate the link 53, with the spring 50 being utilized to absorb excessive travel of the die plate 42 for a purpose to be hereinafter more fully described. As shown primarily in Figs. 1 and 3, the gear box 58 has a plate bracket 66 mounted thereon that is adapted to carry a switch 67 having an operating arm 68 depended therefrom. The operating arm 68 carries a roller 70 that is positioned for cooperation with the cam 56, as will be hereinafter more fully described.

The die plate 43 has a stop member 71 mounted on the lower surface thereof and connected thereto by means of screws 72 and guide pins 73. The stop member 71 has a verticaly disposed end portion 74 that is adapted for cooperation with an adjustable portion 75 of an adjusting block 76. The block 76 is mounted on and connected to the platform 33 and retained in position by means of screws 77, there being an angularly disposed surface 78 on the block 76 and a similarly angularly disposed surface 80 on the portion 75, whereby to permit slight adjustment of the axial position of a stop surface 81 on the portion 75. The portion 75 is adjustably retained in connection with the block 76 by means of screws 82. As shown primarily in Figs. 7 and 11, the portion 74 of the stop member 71 is adapted for cooperation with the stop surface 81 of the portion 75. While the present apparatus is at rest, the end portion 74 of the stop member 71 is biased into contact with the surface 81 by means of a pair of tension springs 83 having one of their ends connected to pins 84 disposed downwardly from the die plate 42 and the other of their ends connected to pins 85 disposed upwardly from the platform 33, thus to position the die plate 43 as shown primarily in Figs. 1, 2, 5, 6 and 11.

Figures 3, 12:
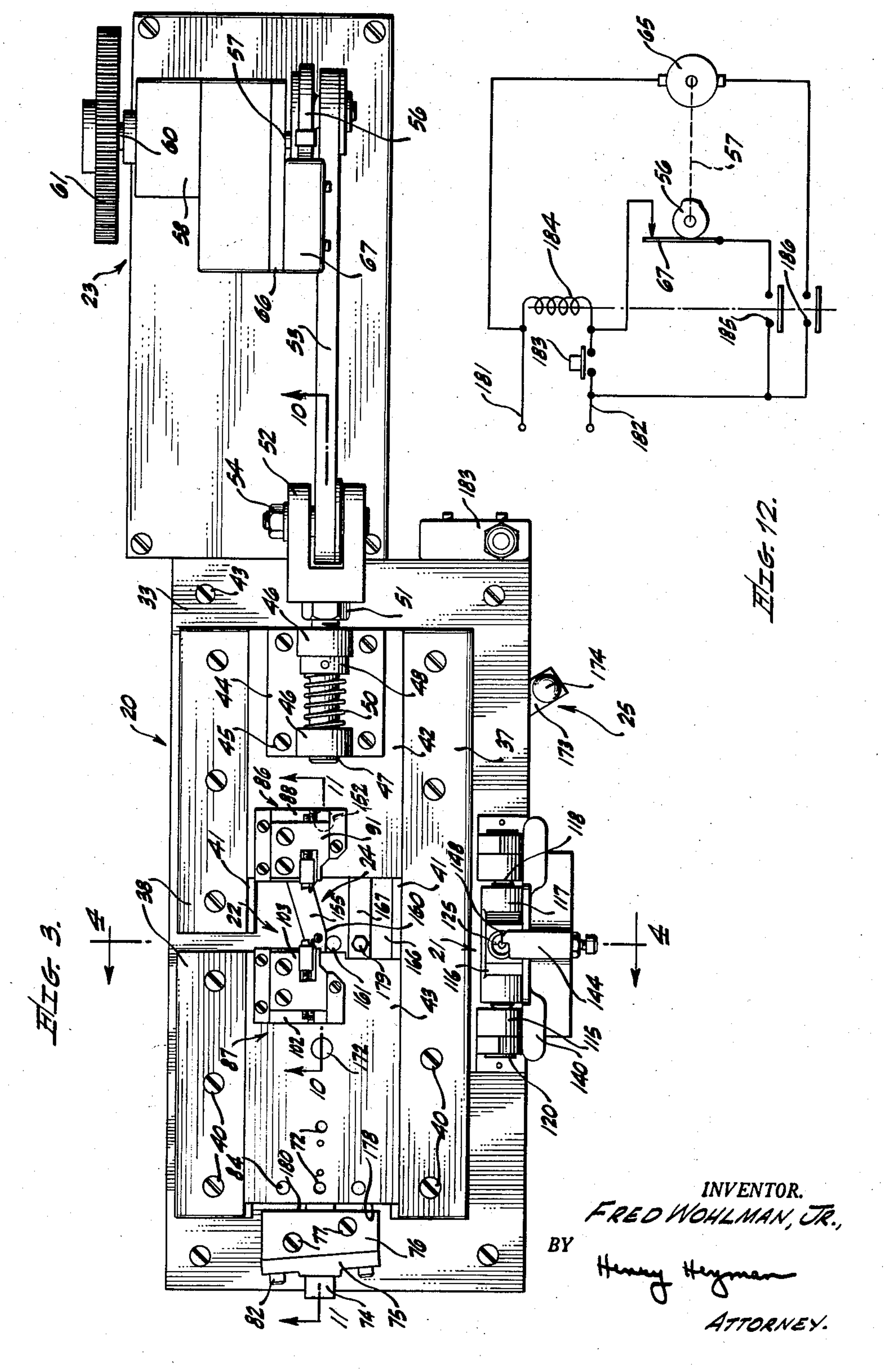
Fig. 3 is an oblique view of the upper portion of the present apparatus showing the relationships of various components thereof, with the apparatus in an open position preparatory for reception of a semiconductor translating device component.
Fig. 12 is a diagrammatic view showing a typical wiring diagram that may be employed with the present apparatus.
Figures 4, 9:
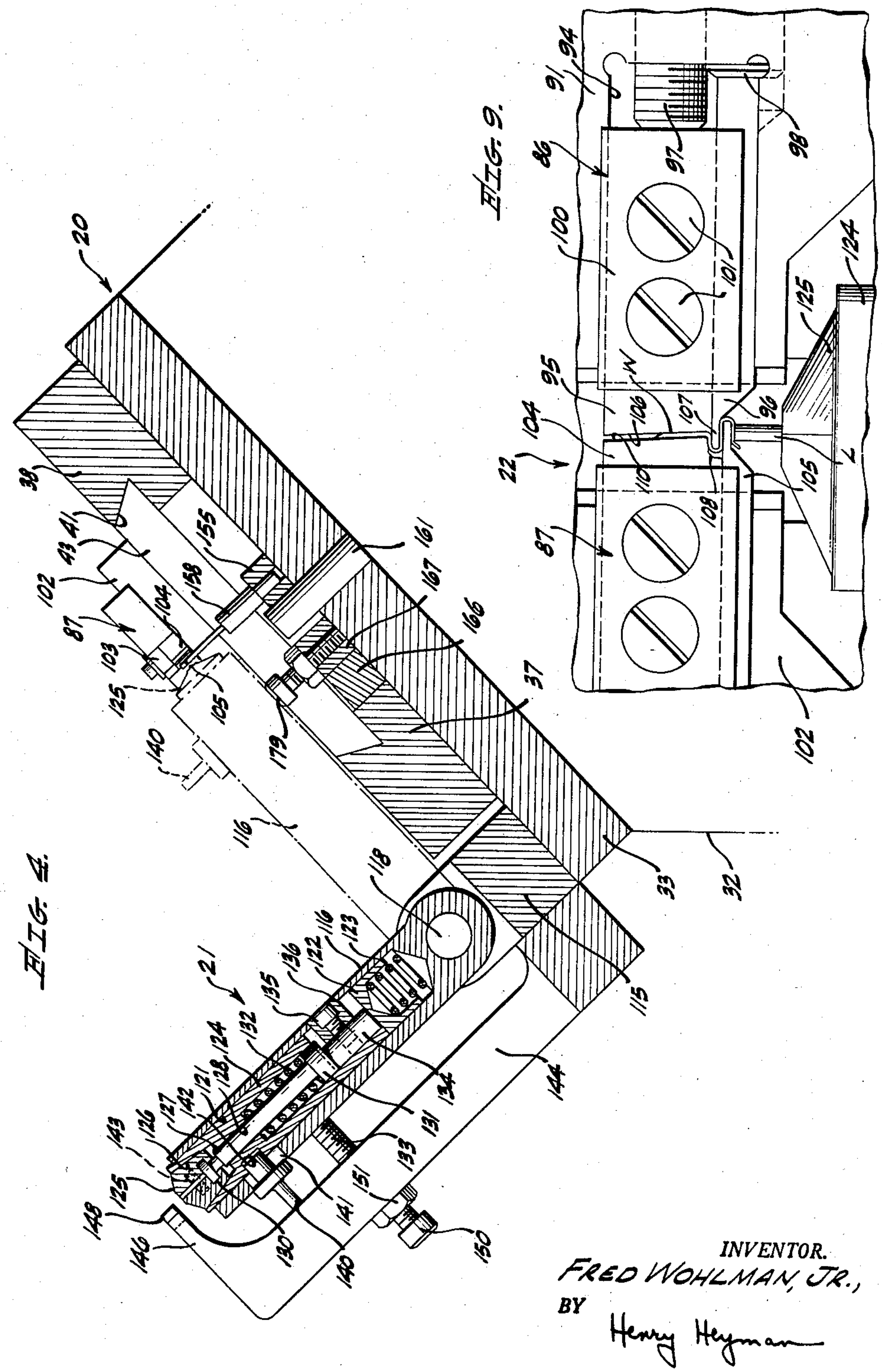
Fig. 4 is an enlarged transverse sectional view taken substantially as indicated by line 4—4, Fig. 3 and showing details of the holding, supporting and aligning structure for components of semiconductor translating devices.
Fig. 9 is a further fragmentary view similar to Fig. 8 showing the dies in a closed position.
Figure 7:
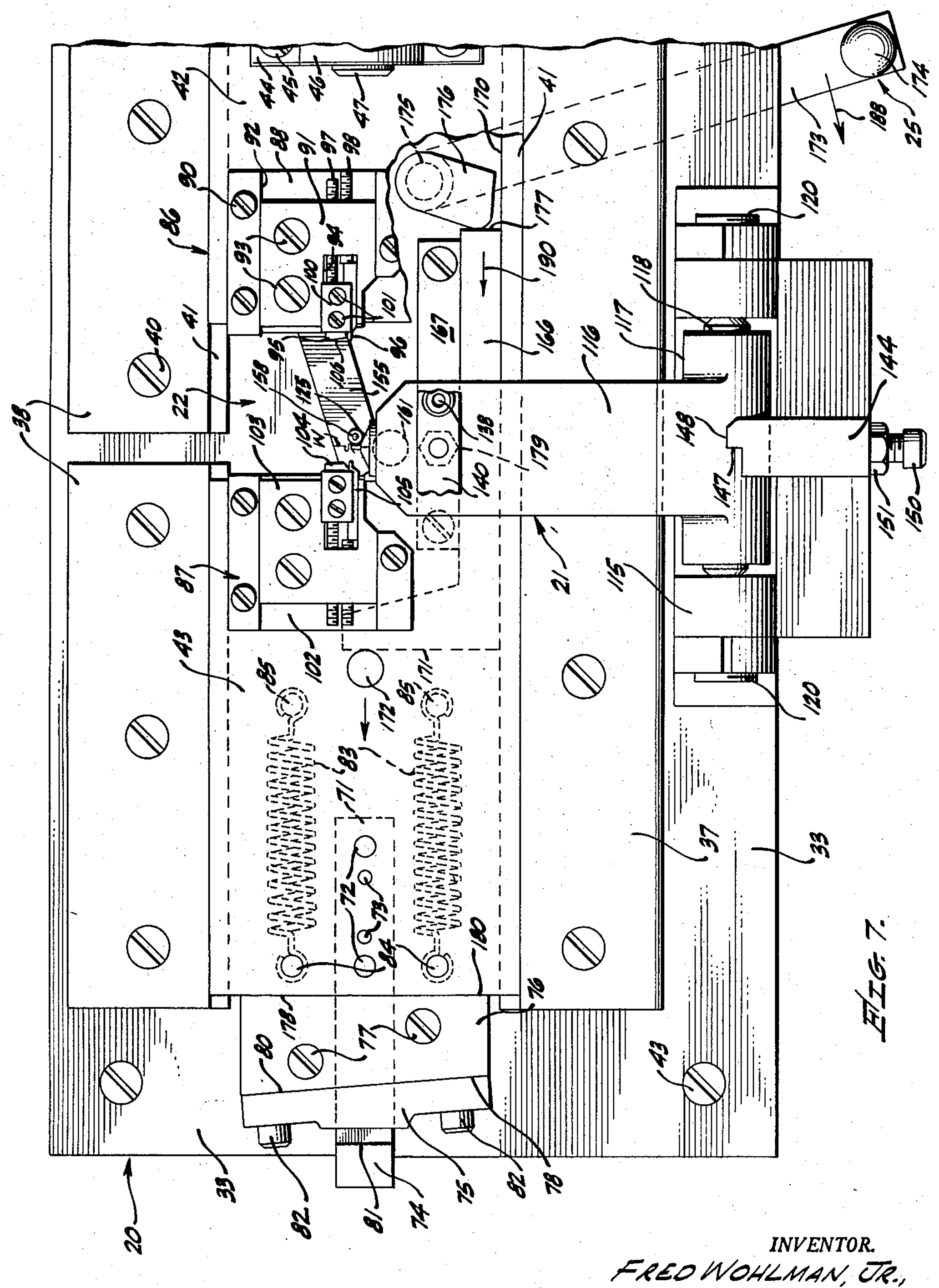
Fig. 7 is a fragmentary view similar to Figs. 5 and 6 showing the dies after having manually been moved to an open position to permit removal of the finished semiconductor translating device component.
Figure 10:
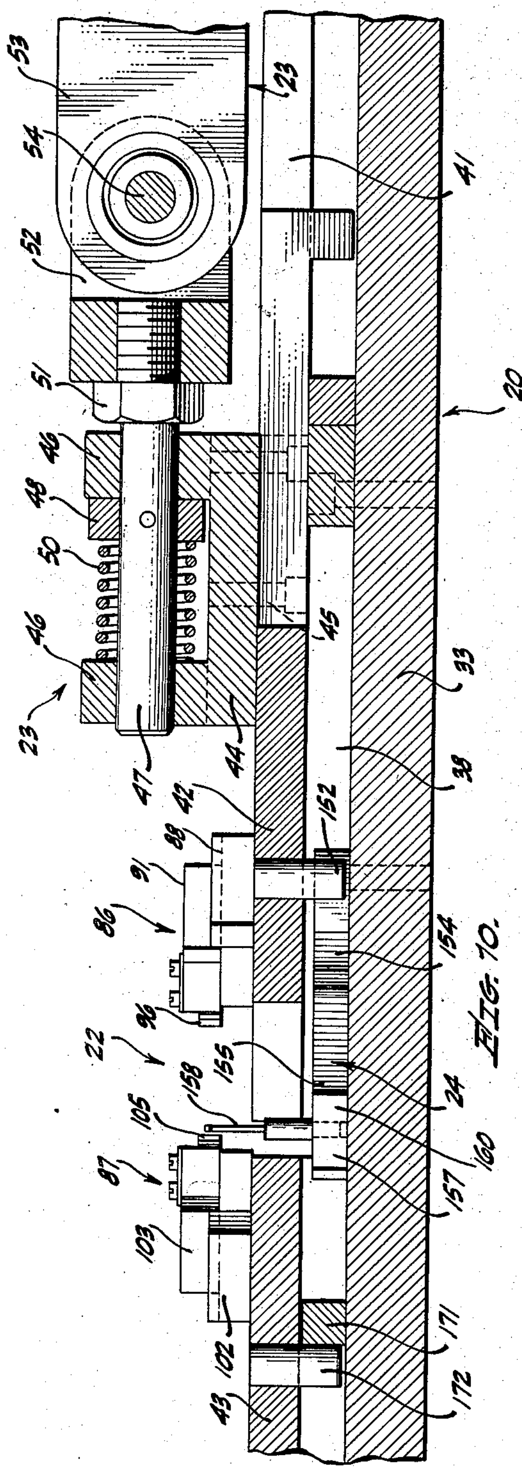
Fig. 10 is a longitudinal sectional view on an enlarged scale through the present apparatus as taken substantially as indicated by line 10—10, Fig. 3.

With reference now primarily to Figs. 3, 7 and 9, the dies 22 are shown as being mounted on the die plates 42 and 43. The die plate 43 carries a movable die member indicated generally at 86, while the die plate 43 carries a normally stationary die member indicated generally at 87. The die member 86 includes a mounting block 88 that is connected to the die plate 42 by means of screws 90. An adjustable die supporting member 91 is positioned in ways 92 in the mounting block 88 and adjustably retained therein by means of screws 93 which are threadably disposed through the supporting member 91 and engage a planar surface of the mounting block 88. As shown in detail in Fig. 9, the die supporting member 91 has a rectangular cutout 94 in which die members 95 and 96 are adjustably positioned. A pair of adjusting screws 97 and 98 threadably engage the die supporting block 91 and extend into the cutout 94 for engagement with rearward ends of the die members 95 and 96. Thus, the relative positions of the die members 95 and 96 may be changed by manipulation of the screws 97 and 98. Once the position of the die members 95 and 96 is established, they are locked into position by means of a lock plate 100 and screws 101 which extend through the die member 95 and threadably engage the mounting block 88.

The die supporting structure 87 is similar to the die supporting structure 86 having a supporting block 102, mounting block 103 and pair of adjustably positioned die members 104 and 105. As shown in Fig. 9 the die member 95 has a slight angularly disposed face 106 while the die member 96 has a protruding finger portion 107. The die member 104 has a recess 108 and an angularly disposed surface 110, the surface 110 being parallel to the surface 106 on the die member 95. The die member 105 has a protruding finger portion 111. As shown, the finger portion 107 on the die member 106 is adapted for cooperation with the recess 108 on the die member 104 and with one side of the finger 111 of the die member 105, whereby to effect the kinking or bending of a wire W forming a whisker of a semiconductor translating device into a desirable S-shaped configuration. In this connection, it is clearly to be understood that the particular configuration of the wire W may vary with different types of semiconductor translating devices and that the device of the present invention may be utilized with various types and shapes of die members without departing from the spirit and scope hereof.

With reference now primarily to Figs. 1, 2, 3, 4 and 5, the platform 33 has a clevis shaped bracket member 115 mounted on one edge thereof in which the semiconductor component supporting structure 21 is mounted. The structure 21 includes an elongated body portion 116, the lower end of which is provided with laterally extending bosses 117 from which conical pivot members 118 extend. The pivot members 118 are adapted for cooperation with inner ends of adjusting screws 120 that are disposed inwardly from upstanding portions of the clevis shaped mounting bracket 115.

Figures 5, 6:
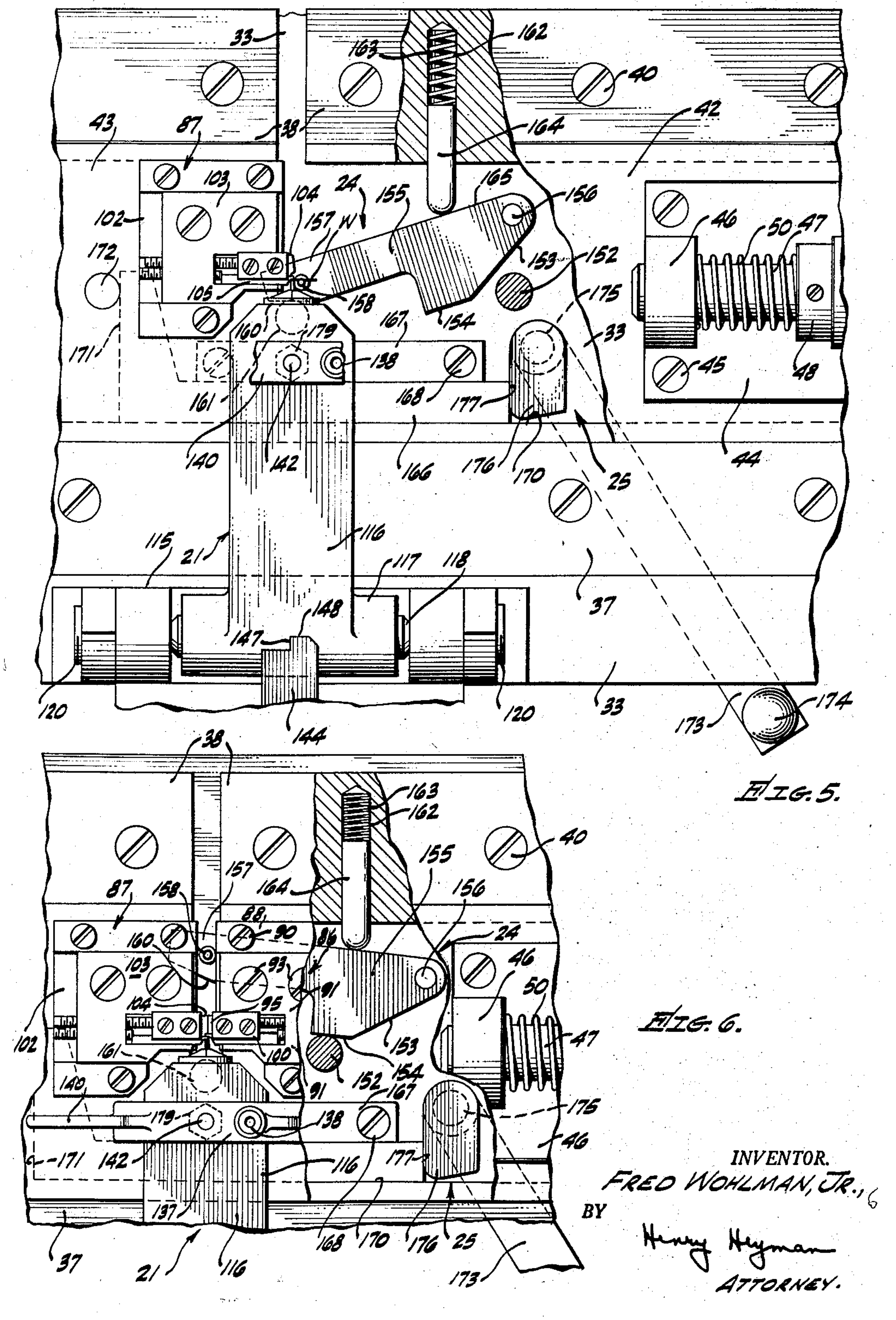
Fig. 5 is an enlarged fragmentary view, partially in section, showing a semiconductor translating device component in position prior to formation of the whisker thereof.
Fig. 6 is a view similar to portions of Fig. 5 showing the dies in a closed position immediately following formation of the whisker.

As shown in Fig. 4, the component support housing 116 has an elongated bore 121 therein in which a cup shaped member 122 is positioned, the member 122 being urged outwardly by means of a compression spring 123. A chuck supporting member 124 is slidably positioned in the bore 121 and has a lower end portion that is adapted to bear against an upper surface of the cup shaped member 122. The chuck supporting member 124 has a plurality of chuck jaws 125 disposed in a conical recess 126 in the upper end thereof, there being a shaft 127 extending from the jaws 125 through a bore 128 in the chuck supporting member 124. The upper end of the shaft 127 has a collar 130 that is adapted for reception in suitable slots in the jaws 125 and the lower end of the shaft 127 is fitted with a second collar 131, there being a compression spring 132 disposed between the collar 131 and a shoulder 133 in the chuck supporting member 124. Thus, the chuck jaws 125 are biased toward a closed position and into the conical recess 126. A stop member 134 is connected to the body 116 by means of a screw 135 and spacer 136, one end of the stop member 134 being adapted for engagement with an outer end of the collar 131, the other end of the stop member 134 engaging the upper surface of the cup shaped member 122. With reference to Figs. 4 and 6, a chuck operating lever 137 is pivotally mounted on an outer surface of the body 116 by means of a shaft 138, there being a pin 140 disposed from the arm 137, through a slot 141 in the body 116 and into a recess 142 in the chuck supporting member 124. Accordingly, when one end of the lever 137 is depressed to rotate the lever about the pivot 138 therefor, the pin 140 serves to move the chuck supporting member 124 into the bore 121 and against the compression of the spring 123. The stop member 134 prevents inward movement of the shaft 127 by engagement therewith, whereby to compress the spring 132 and move the jaws 125 outwardly from the conical recess 126. Compression springs 143 between the jaws 125 serve to move the jaws apart to enable reception of a lead component L of the semiconductor translating device component.

The bracket 115 also serves to support an alignment member 144 that is retained thereon by means of screws 145. The alignment member, Figs. 4 and 5, has an upper generally L-shaped portion 146 that is provided with a notch 147 and an alignment surface 148 to be used for a purpose to be hereinafter more fully described. The guide member 144 is also provided with an adjustable screw 150 that extends therethrough and is fitted with a lock nut 151. An inner end of the screw 150 is adapted for cooperation with an outer surface of the holding member body 116, whereby to align the approximate centerline of the chuck jaws 125 with the guide surface 148.

Figure 11:
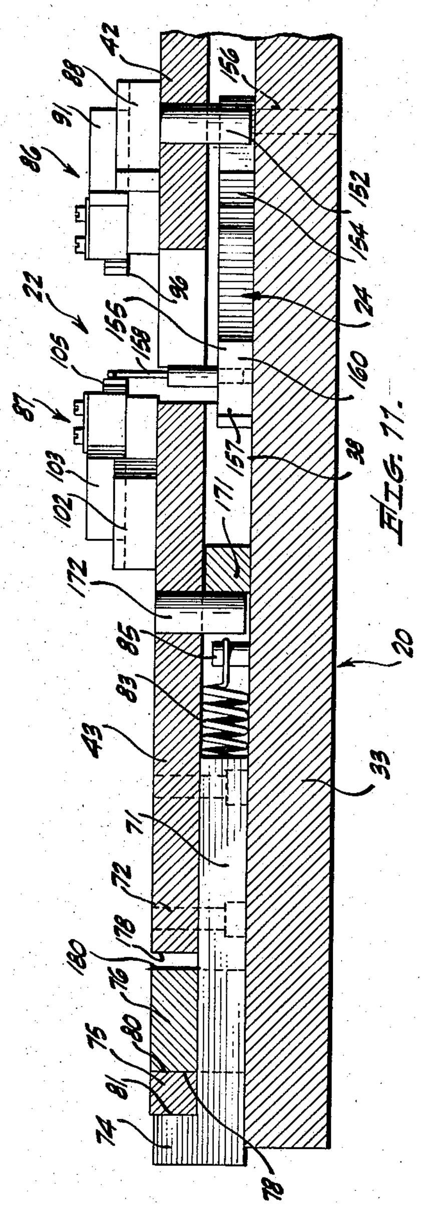
Fig. 11 is a continuation longitudinal sectional view of Fig. 10 as taken substantially as indicated by line 11—11, Fig. 3.

With reference primarily to Figs. 5, 6 and 11, the die plate 42 has depended downwardly therefrom a pin 152. The pin 152 is adapted for cooperation with edge surfaces 153 and 154 of a lever 155. The lever 155 is mounted on a stub shaft 156 that is carried by the platform 33 and has an outer end portion 157 that carries an upstanding whisker preforming rod 158. The lever portion 157 is also provided with a surface 160, Fig. 3 that is adapted for engagement with a stop pin 161 disposed upwardly from the platform 33. The lever 155 is biased for engagement with the stop pin 161 by means of a compression spring 162 disposed in a recess 163, in one of the way members 38, and a button 164 that extends outwardly from the recess 163 for engagement with an edge surface 165 of the lever 155. Thus, as the die plate 42 is moved leftwardly, as seen in Fig. 3, the lever 155 will be moved from the position shown in Fig. 5 to the position shown in Fig. 6 by engagement of the pin 152 with the surfaces 153 and 154 of the lever 155.

In some instances, it is necessary that the die members be moved from their normal positions in order that the formed whisker may be moved therefrom. For this purpose, a generally L-shaped actuating arm 166 is slidably disposed between a guide member 167, mounted on the platform 33 and retained therein by means of screws 168, and an inner surface 170 of the way member 37. An outer end 171 of the actuating arm 166 is adapted to bear against a pin 172 disposed downwardly from the die plate 43. As shown primarily in Figs. 5, 6 and 7, a lever 173, having a handle 174, is pivoted as at 175 to the platform 33. The lever 173 has a stub portion 176 that is engageable with an end 177 of the actuating member 166. Accordingly, when the lever 173 is moved leftwardly from the position shown in Fig. 5 to the position shown in Fig. 7, the actuating member 166 is moved in a direction to move the die plate 43 and the die structure 87 carried thereby in a leftward direction with movement being limited by engagement of an end 178 of the die plate 43 with an edge 180 of the stop block 76. Thus, the formed whisker will be left in an opened position as shown in Fig. 7 to enable removal from between the various die members without damage to the formed whisker.

In operation of the present apparatus, the holding and supporting structure 21 is first positioned as shown in Figs. 3 and 4 and the arm 137 is operated to open the chuck jaws 125 whereby to receive the lead L of the translating device component. At this time, the lead L has had the wire contact member or whisker W affixed to an end thereof with the whisker extending laterally from an end face of the lead L as shown primarily in Fig. 5. The operator, while the jaws 125 are open draws a finger across the laterally disposed whisker W to position the whisker along the alignment surface 148 of the aligning member 144. The supporting structure 21 is then manually swung about the pivots 118 thereof to the position shown in Fig. 5, with the whisker W lying above and adjacent to the rod 158 extending from the lever 155. The lowermost position of the structure is determined by engagement of the housing 116 with a stop member 179 that is attached to the guide member 167 as shown in Fig. 4.

As shown primarily in Fig. 12, the present device is connected to a suitable electrical system whereby to effect operation thereof through a single reciprocating cycle. Electrical energy is supplied through a pair of leads 181 and 182, there being a push button switch 183 positioned in the lead 182. The leads 181 and 182 extend to a coil 184 of a relay having pairs of contacts 185 and 186. The contacts 185 are wired in series with the switch 67 and about the switch 183, whereby to provide a holding circuit for the coil 184. The contacts 186 connect the lead 182 to the driving motor 65, the other side of the motor 65 being connected to the lead 181. Accordingly, when the switch 183 is momentarily closed the contacts 185 and 186 will also be closed by action of the relay coil 184, with the holding circuit through the switch 167 being interrupted by action of the cam 56 upon completion of one cycle thereof. Accordingly, the die plate 42 will move leftwardly and then rightwardly to complete one cycle and stop until such time as the switch 183 is again closed.

During the operating cycle and movement of the die plate 142, the lever 155 will be moved as described hereinbefore by action of the pin 152, whereby moving the arm portion 157 and the rod carried thereby from the position shown in Fig. 5 to the position shown in Fig. 6 and sweeping the whisker W upwardly over the faces of the die members 104 and 105. This action is shown in enlarged detail in Fig. 8 with the initial position of the whisker W being shown in solid lines and the upwardly swept position being shown in dotted lines, the arrow 187 indicating the direction of travel of the rod 158 and portion 157 of the lever 155.

With the rod 158 being moved upwardly out of the path of the die structures 86 and 87, the dies then move to the positions shown in Fig. 9, whereby to form the whisker W into the desired configuration. Proper tension between the faces of the die members 95, 96, 104 and 105 is maintained by the spring 50 permitting the operating mechanism 23 slight overtravel through sliding action of the shaft 47 through the journals 46 of the bracket 44. Thereafter, the cycle is completed upon movement of the die structure 86 and the die plate 42 to the retracted position shown in Figs. 1, 3, 5 and 7. The die plate 43 is then moved leftwardly, as described hereinbefore, by manual operation of the lever 173, and movement thereof in the direction of the arrow 188, to move the actuating member 166 in the direction of the arrow 190. The holding and support structure 21 for the semiconductor component is thereafter moved from the position shown in Fig. 7 to the position shown in Figs. 2, 3 and 4, with the finished component thereafter being removed from the chuck jaws 125.

The entire action of the apparatus of this invention is such as to permit adequate and accurate forming of the whisker W in spite of the relatively small size thereof and the necessity for the maintenance of precise tolerances. The fully adjustable nature of the various components of the present apparatus enable easy and accurate maintenance thereof and adjustment as necessary in the event of wear or misalignment of any of the components thereof. Additionally, mass production techniques may be maintained over long periods of time without undue strain on, or the necessity for training of experienced operators.

Having thus described the invention and the present embodiment thereof, it is desired to emphasize the fact that many modifications may be resorted to in a manner limited only by a just interpretation of the following claims.

I claim:

1. An apparatus for forming a whisker of a semiconductor translating device component comprising, in combination: a frame structure; a pair of die plates; longitudinal ways in said structure for reciprocally receiving said die plates; multiple, adjustable dies carried by said die plates; a driving motor; means interconnecting said motor and one of said die plates whereby to reciprocate said one of said die plates and said die carried thereby; a resilient connection between said interconnecting means and said one of said die plates; a lever pivotally carried by said frame structure; a whisker preforming member carried by said lever; a lever operating member disposed from said one of said die plates whereby to actuate said lever upon reciprocation of said one of said die plates and to effect engagement between said preforming member and said whisker to bend said whisker about a portion of one of said dies; a resilient backing for the other of said die plates; a manually operable holder for said semiconductor component, said holder being movable from a loading position to a forming position to place said whisker in position relative to said dies for forming thereby; and manually operable die opening means pivotally carried by said frame structure for moving said other of said die plates against said resilient backing therefor, whereby to move one of said dies out of engagement with a formed whisker to permit removal thereof from said forming position.

2. An apparatus for forming a whisker secured transversely to one end of a lead of a semiconductor translating device component comprising, in combination: a frame structure; a pair of die plates; longitudinal ways in said structure for reciprocally receiving said die plates; multiple, adjustable dies carried by said die plates; a driving motor; crank means interconnecting said motor and one of said die plates whereby to reciprocate said one of said die plates and said die carried thereby for one cycle only; a resilient connection between said interconnecting means and said one of said die plates; a lever pivotally carried by said frame structure; a whisker preforming member carried by said lever; a lever operating member disposed from said one of said die plates whereby to actuate said lever upon reciprocation of said one of said die plates and to effect engagement between said preforming member and said whisker to bend said whisker about a portion of one of said dies; a spring urged resilient backing for the other of said die plates; a manually operable holder chuck for said semiconductor component, said holder chuck being movable from a loading position to a forming position to place said whisker in position relative to said dies for forming thereby; and manually operable die opening means pivotally carried by said frame structure for moving said other of said die plates against said spring urged resilient backing therefor, whereby to move one of said dies out of engagement with a formed whisker to permit removal thereof from said forming position.

3. A semiconductor translating device whisker forming apparatus according to claim 2 wherein means are provided for biasing said lever against the direction of actuation thereof by said lever operating member whereby to reset said lever for another cycle of said apparatus.

4. A semiconductor translating device whisker forming apparatus according to claim 2 wherein said one cycle reciprocation of said one of said die plates is controlled by a cam operated switch mechanism driven by said driving motor.

5. A semiconductor translating device whisker forming apparatus according to claim 2 wherein said portion of said one of said dies normally overlies a length of said whisker and said end of said lead, preforming of said whisker being at a point laterally spaced from said end of said lead.

6. A semiconductor translating device whisker forming apparatus according to claim 5 wherein said portion of said one of said dies is independently adjustable from other portions of said one of said dies.

7. A semiconductor translating device whisker forming apparatus according to claim 6 wherein the other of said dies carried by said movable one of said die plates is provided with independently adjustable portions.

References Cited in the file of this patent

UNITED STATES PATENTS

| | | |
|---|---|---|
| 2,450,920 | Shand | Oct. 12, 1948 |
| 2,456,353 | Wolf | Dec. 14, 1948 |
| 2,549,061 | Dauenhauer | Apr. 17, 1951 |
| 2,677,173 | Fisler | May 4, 1954 |